United States Patent [19]

Waitl et al.

[11] Patent Number: 5,040,868
[45] Date of Patent: Aug. 20, 1991

[54] SURFACE-MOUNTABLE OPTO-COMPONENT

[75] Inventors: Guenther Waitl; Franz Schellhorn, both of Regensburg, Fed. Rep. of Germany

[73] Assignee: Siemens Aktiengesellschaft, Munich, Fed. Rep. of Germany

[21] Appl. No.: 531,459

[22] Filed: May 31, 1990

[30] Foreign Application Priority Data

May 31, 1989 [EP] European Pat. Off. ........ 89109835.2

[51] Int. Cl.⁵ .............................................. G02B 6/42
[52] U.S. Cl. ...................... 358/33; 385/14; 385/88; 357/80
[58] Field of Search ............... 350/96.11, 96.15, 96.17, 350/96.20; 357/74, 79, 80

[56] References Cited

U.S. PATENT DOCUMENTS

| 4,000,437 | 12/1976 | Lederhandler et al. | 313/500 |
| 4,439,006 | 3/1984 | Stevenson | 350/96.20 |
| 4,638,343 | 1/1987 | Althaus et al. | 357/17 |
| 4,864,471 | 9/1989 | Hargasser et al. | 361/417 |
| 4,897,711 | 1/1990 | Blonder et al. | 357/74 |
| 4,930,857 | 6/1990 | Acarlar | 350/96.2 |
| 4,945,400 | 7/1990 | Blonder et al. | 357/74 |

FOREIGN PATENT DOCUMENTS

| 0218832 | 8/1986 | European Pat. Off. . |
| 0230336 | 1/1987 | European Pat. Off. . |
| 3231277A1 | 2/1984 | Fed. Rep. of Germany . |
| 3703423A1 | 8/1988 | Fed. Rep. of Germany . |
| 2520935 | 8/1983 | France . |
| PCT/EP82/-00153 | 2/1983 | PCT Int'l Appl. . |
| PCT/GB84/-00330 | 4/1985 | United Kingdom . |

OTHER PUBLICATIONS

IBM Technical Disclosure Bulletin, vol. 13, No. 3, Aug. 1970, "Photodetector As Function Detector", Richards, pp. 591–592.

Primary Examiner—John D. Lee
Attorney, Agent, or Firm—Hill, Van Santen, Steadman & Simpson

[57] ABSTRACT

A surface-mountable opto-component capable of flexible use is disclosed. The opto-component has at least one base member that can be automatically assembled with the assistance of an assembly means and contains at least one optical transmitter and/or receiver. The opto-component also has at least one optical means for shaping the light to be emitted and/or to be received. Adjustment aids serve for the adjusted fastening of the at least one optical means.

24 Claims, 11 Drawing Sheets

SURFACE-MOUNTABLE OPTO-COMPONENT

BACKGROUND OF THE INVENTION

The present invention is directed to a surface-mountable opto-component.

SMD (Surface Mounted Device) stands for a new construction technique for PC modules. It covers both a new type of processing the components, namely, surface mounting, as well as a new generation of components that must fit the new technique.

Surface mounting will replace the traditional technique of plug-in mounting to a greater and greater degree. Surface mounting means that unwired components instead of wired components are brought onto printed circuit boards or onto some other substrate. Further advantages can be utilized with SMD: the PC modules become up to 70% smaller; manufacture becomes more rational; and reliability is increased.

Surface-mountable components can be economically employed when they are processed in automatic assembly machines. The advantages of surface mounting are all the greater the better the components, printed circuit board layout, automatic assembly, soldering technique, and testing are adapted to one another.

Surface-mountable opto-components are disclosed by EP-A-0 083 627, incorporated herein by reference. An opto-electronic semiconductor member is thus arranged on a substrate formed of ceramic material. A light-transmissive layer having a dome-like arc that is composed of epoxy resin is arranged over the semiconductor member. This known component is essentially envisioned for display arrangements. The given, dome-like arc of the light-transmissive layer composed of epoxy resin on the semiconductor member makes flexible use of the known component more difficult.

SUMMARY OF THE INVENTION

An object of the present invention is to specify a surface-mountable opto-component of the type initially cited that can be flexibly employed.

This object is inventively achieved by a surface-mountable opto-component having at least one base member with a mounting surface shaped for automatic placement on a surface by use of an automatic assembly means. The base member contains at least one optical transmitter and/or receiver. At least one optical means is provided for shaping light beams associated with operation of the transducer. Adjustment means are provided on the base member for an adjusted fastening of the at least one optical means.

It is possible in the present invention that the optical means for shaping the light to be beamed out and/or to be received lies in such fashion on the base member that practically no light is laterally lost between the optical means and the base member.

In the present invention, a transmitter and/or receiver are arranged in depressions of the base member. A cross-talk between various transmitters on a printed circuit board or on a substrate on which a plurality of base members are arranged is thus avoided. Such a depression can be designed as a reflector in a simple way.

When a receiver is arranged in a depression, then the signal-to-noise ratio is noticeably improved because of the reduced sensitivity to side light.

Since the base member in the present invention does not comprise a dome-like arc at its surface, it can be more exactly positioned with the assistance of an assembly means.

The positioning precision between the base member and the optical means is also greater in the present invention than the positioning precision of a reflector with respect to the known component that has the known, dome-like arc at its surface. Resulting therefrom are more constant out-coupling conditions and a better impression on the part of the viewer.

Advantageously, the base member has an essentially planar surface, this being beneficial for the assembly technique.

Advantageously, adjustment aids are applied both in the base member as well as in the optical means, for example in the form of pegs, clamps, channels, bores, and depressions that also serve the purpose of fastening the optical means to the base member.

A single optical means can be provided for a plurality of base members. Conversely, a plurality of optical means can be employed for one base member.

The invention enables the manufacture of surface-mountable opto-components with variable optics given low manufacturing expense. In the prior art, a specially adapted housing had to be manufactured for every variation in the optics. This requires high capital costs in the area of final assembly, particularly in the component enveloping. In addition, the mounting possibilities of the SMD automatic assembly machines constrict the design of the optics.

The invention permits the manufacture of surface-mountable structures (basic components) that can be cost-beneficially manufactured, that can be processed on commercially available automatic equipping machines, and wherein it is possible that these basic components are coupled to an optics adapted to the respective application only after the assembly and soldering process.

The number of structures is greatly reduced due to the separation of the base member and optics (optical means). The high demands that are made of a SMD component with respect to mountability and solderability can be more reliably realized with a component of the invention. The construction of the optics with respect to design and selection of materials can be significantly better optimized to the respective application.

The basic component (the base member) contains the optical transmitters and/or receivers. Given optical transmitters, it is advantageous to mount the semiconductor component in a reflector. This reflector can be constructed either as a stamping, embossment, or engraving in a metal carrier or by enveloping the reflective, potentially highly reflective plastic. A combination of embossing in a metal carrier and enveloping with a reflective plastic is likewise possible. The exterior shape of the component is designed such that the essentially planar surface of the base member that is beneficial for the assembly technique is present and that adjustment aids for the connection of the base member to the optics are additionally applied in the base member.

The optics (the optical means) is designed according to the respective application. Opto-components having a narrow or broad emission reception characteristics can be realized. Given the employment of deflection devices in the optical means, the transmission or reception direction can be turned by an angle of, for example, 90°. It is thus possible that what are referred to as side-looker structures become superfluous. In side-looker structures, the transmitter or the receiver of the component looks in a direction parallel to the surface of the substrate on which the component is arranged.

When, instead of a lens optics, a light waveguide is adapted with the assistance of an optical means, then a SMD-capable light waveguide (LWL) component is obtained.

SMD components are disclosed by U.S. patent application bearing U.S. Ser. No. 904,638, filed 8 September 1986 (now U.S. Pat. No. 4,864,471), by European Patent EP-A-0 218 832, by German Patent DE-A-32 31 277 and by the PCT Patent Application WO-A-85/01634, all incorporated herein by reference.

DESCRIPTION OF THE PREFERRED EMBODIMENTS

FIG. 1a–1f schematically show possible embodiments of base members 1. The base members 1 contain at least one depression 5 in which the opto-transmitters and/or opto-receivers are arranged. These depressions can be advantageously designed as reflectors for optical transmitters. The depressions 5 are advantageously cast out with plastic, for example with casting resin. The surface of the base member 1 that faces away from that substrate on which the base member 1 is mounted is essentially planar. This means that the planar surface can be automatically sucked up by a means for assembling components and can be sucked up with a high clock rate. Base members having a planar surface can therefore be very quickly and very precisely positioned on a substrate, for example on a printed circuit board. For better adjustment of the optical means on the base members 1, the base members 1 can be provided with grooves 2, bores 3 or pegs 4. Over and above this, a multitude of further adjustment aids for fastening optical devices with respect to the base member 1 are possible and are known to a person skilled in the art.

FIGS. 2a–2c and 3a–3c explain the assembly on base members 1. Electrical terminals 6, 7 are held together during the application of a semiconductor body 8 and of a bond wire connection between the semiconductor body 8 and the electrical terminal 6 in what is referred to as the lead-frame technique. The semiconductor body 8, the bond wire, and parts of the electrical terminals 6, 7 are coated or cast out with plastic such as, for example, thermo-set plastics or thermal plastics only after the production of the bond wire connection. The lead frame can also be first covered with plastic, for example with thermal plastic, and a semiconductor body 8 can then be arranged in the inside of the depression 5. The depression 5 finally can be cast out with casting resin. Adjustment aids such as, for example, bores 3 can be provided in the envelope of the base member 1. The electrical terminals 6, 7 can be bent in the region in which they project from the envelope of the base member 1 such that, as in FIG. 2, they look away from the envelope of the base member 1 or, as in FIGS. 3a–3c, they are bent downwardly in the direction toward the middle of the envelope of the base member.

Only a few basic shapes are required for the base member 1 in the invention. Moreover, plastic material that withstands the high temperatures and other stresses occurring in surface mounting are required to only a slight extent. All SMD-capable materials can be employed for the envelope of the base member 1. For example, LCP (liquid crystal polymer) material can be employed for the envelope for the base member 1. Although only a few basic shapes 1 are required, the invention enables a great design freedom in the fashioning of opto-components.

When a thermo-set plastic is employed for the envelope of the base member 1, this plastic withstands the standard soldering temperature between 200° and 280° C.

Figure 1A:
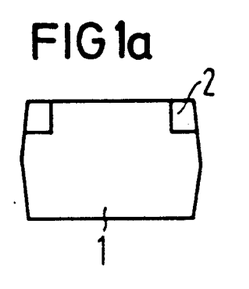
FIGS. 1a–1f schematically shows possible base members.
Figure 1B:
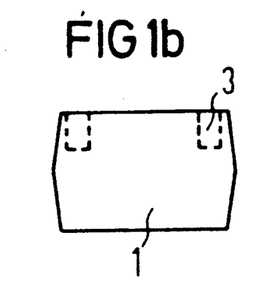
Figure 1C:
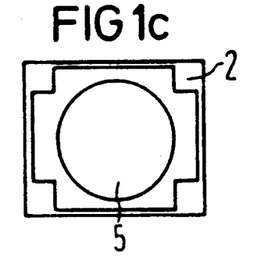
Figure 1D:
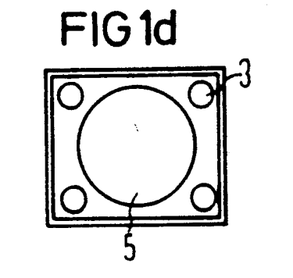
Figure 1E:
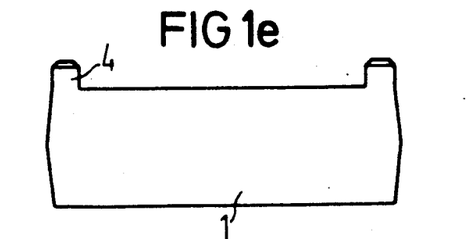
Figure 1F:
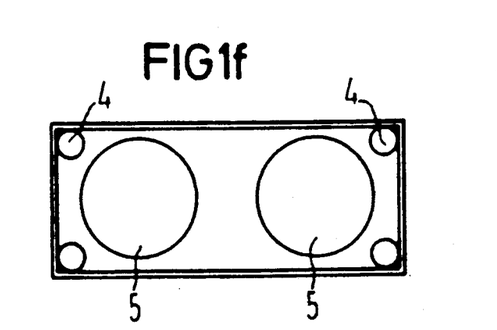
Figure 2A:
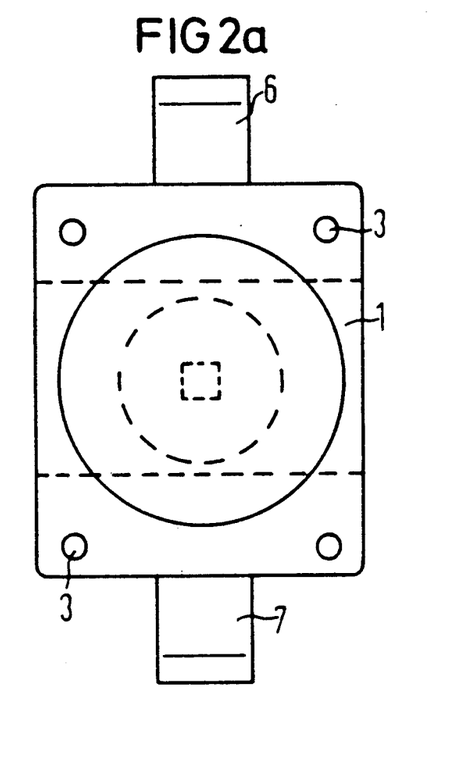
FIGS. 2a–2c and 3a–3c explain the manufacture of base members.
Figure 2B:
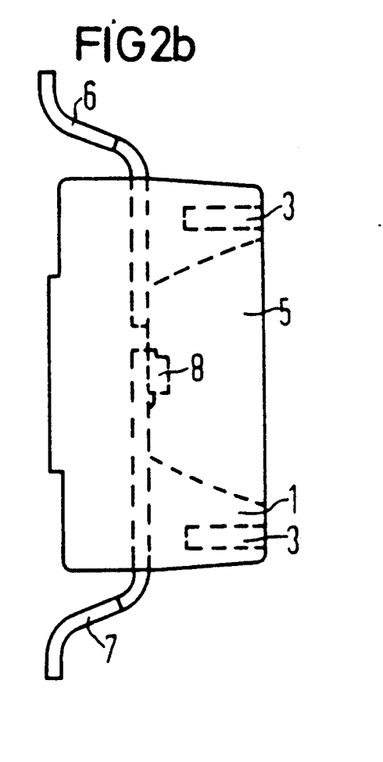
Figure 2C:
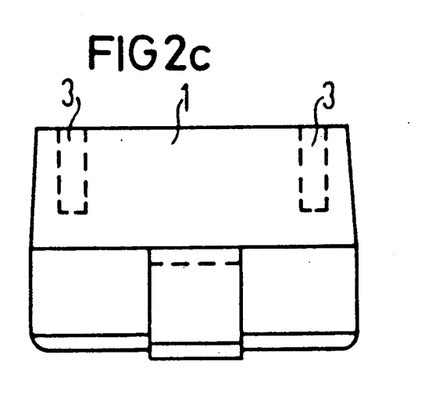
Figure 3A:
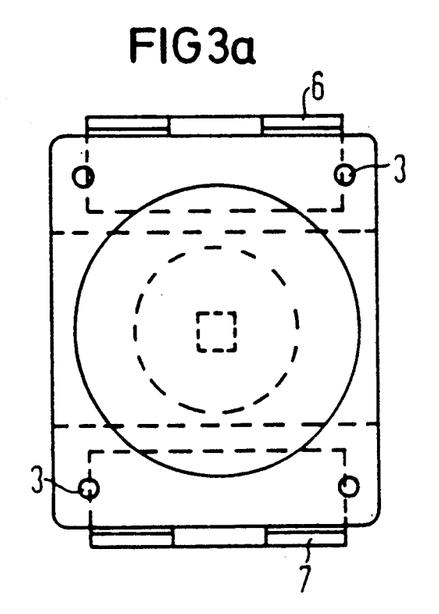
Figure 3B:
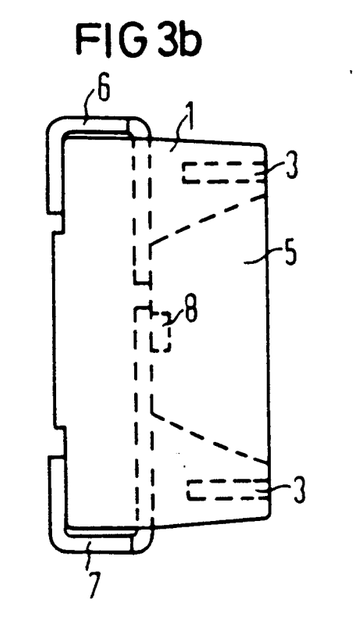
Figure 3C:
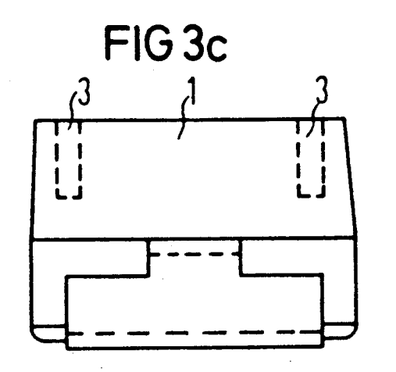
Figure 4:
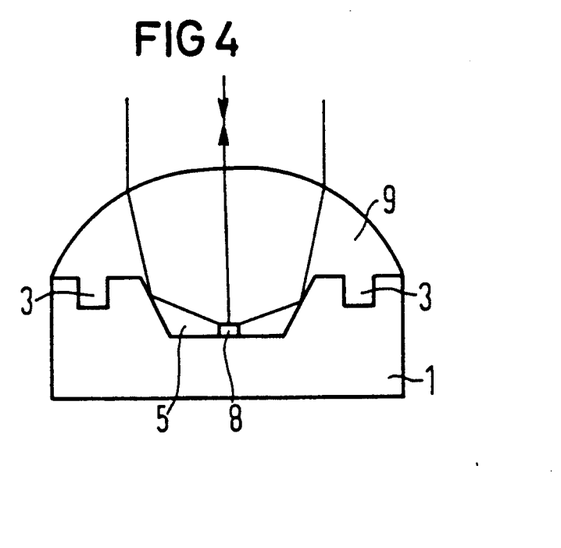
FIGS. 4 through 23 show possible embodiments of opto-components.

FIGS. 4 through 23 explain possible embodiments of opto-components of the invention. FIG. 4 shows a base member 1 having an optical transmitter 8 in a reflector 5. Pegs of an optical means 9 are plugged into bores 3 of the base member 1. The optical means 9 is constructed to be one piece with these pegs. Fully cast members can be employed as optical means 9. For example, glass lenses having a defined refractive index can be employed as optical means 9. However, other devices that shape, focus or fashion the light emanating from the optical transmitter or the light received by the optical receiver 8 in some fashion or other can also be employed as optical means 9. The invention makes it possible to employ a material for the optical means 9 that need not necessarily durably withstand high temperatures. For example, polycarbonate (transparent for lenses or filled white for displays) can be employed for the optical means 9. A cost-beneficial plastic such as Pocan (polybutylene-terephthalate) can also be employed for the optical means 9. For example, such plastics withstand a continuous temperature up to 150° C.

The optical means 9 in FIG. 4 is designed, for example, as a collecting lens. Parallel light is thereby converted into focused light and vice versa. A multitude of emission and/or reception characteristics can be achieved on the basis of the design of depression (reflector) 5 and/or optical means 9. For any arbitrary application, thus the housing shape most suitable therefor can be manufactured given employment of only a very few base members 1.

Figure 5:
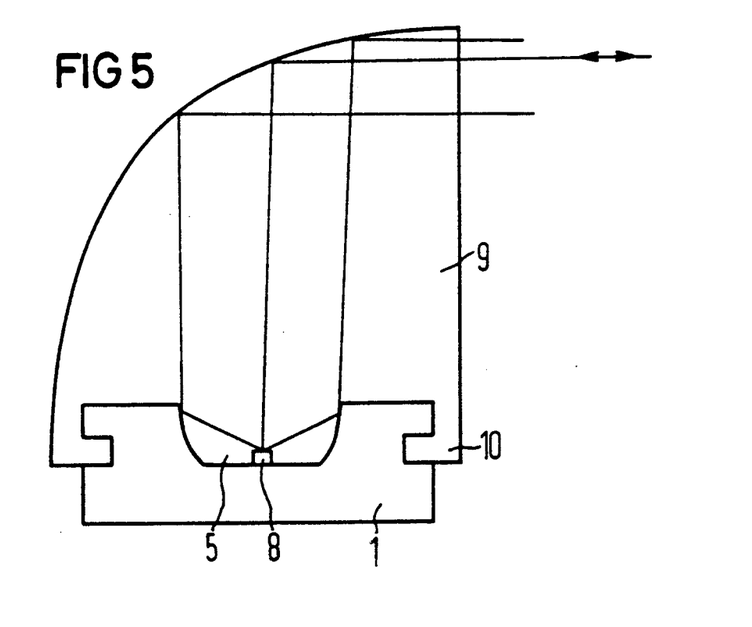

FIG. 5 shows an opto-component wherein the optical means 9 is designed such that the light emanating from the optical transmitter and/or the light received by the optical receiver 8 is deflected by 90°. The light entry and/or light exit faces of the optical means 9 thereby have reflective curves and lens-shaped curves. Such emission or reception characteristics are disclosed in German Utility Model 85 00 013.2 (U.S. patent application Ser. No. 723,236, filed on 15 April 1985 (now U.S. Pat. No. 4,638,343), incorporated herein by reference).

In FIG. 5, the optical means 9 is constructed as one piece with clamps 10. The clamps 10 are retained in notches or channels of the base member 1.

Figure 6:
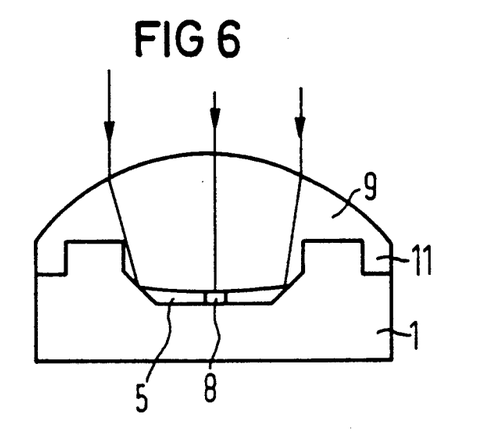

FIG. 6 shows an opto-component having a base member 1, whereby a semiconductor detector is arranged in a depression 5. The optical means 9 has a projection at its outer edge, this projection being plugged onto notches 11 of the base member 1.

The base member 1 can also be manufactured of a material other than plastic material. The base member 1 need not necessarily have a planar surface toward the optical means 9. The optical means 9 can be shaped in a simple way such that it is placed onto the base member 1 and practically no light can laterally emerge between the base member and the optical means.

Figure 7:
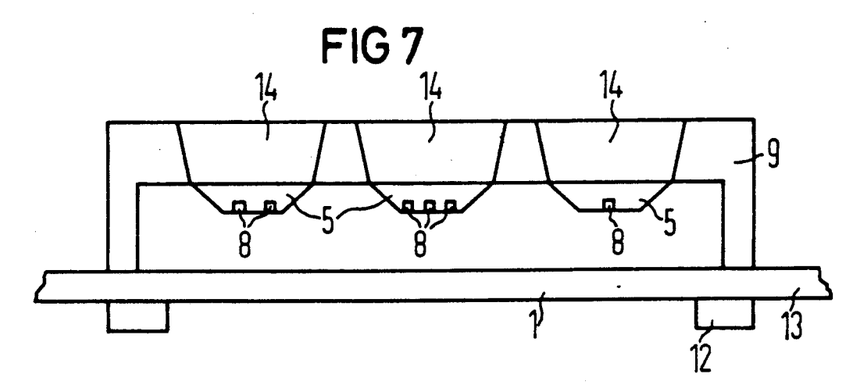
Figure 8:
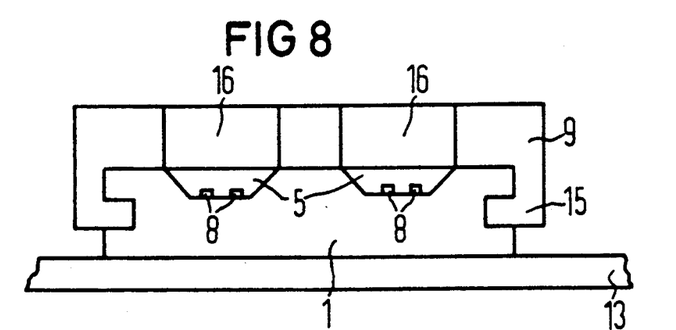

FIGS. 7 and 8 show display components wherein different pluralities of transmitters and/or receivers 8 are arranged in a plurality of depressions 5. The beam shaping in the present invention can generally be undertaken such that a respective contribution to the beam shaping is supplied both by the shaping of the depressions 5 as well as by the fashioning of the optical means 9. In FIG. 7, the depressions 5 have relatively small apertures. These relatively small apertures of the depressions are additionally optically widened by upwardly expanding apertures 14 in the optical means 9.

The base member 1 in FIG. 7 is secured on a substrate on a printed circuit board 13. The optical means 9 thus comprises clamps 12 that are secured in openings of the substrate 13.

In FIG. 8, the optical means 9 has clamps 15 that snap into notches of the base member 1. In FIG. 8, the optical means 9 has apertures 16 that do not additionally optically widen the apertures of the depressions 5 in the base member 1.

Figure 9:
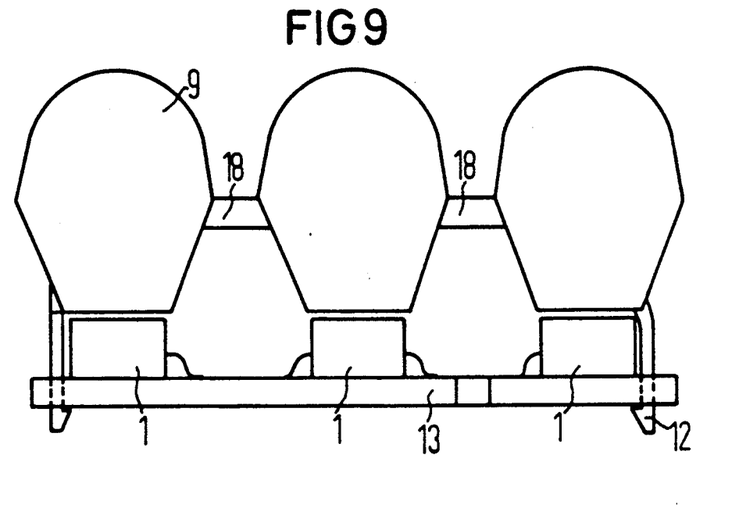
Figure 10:
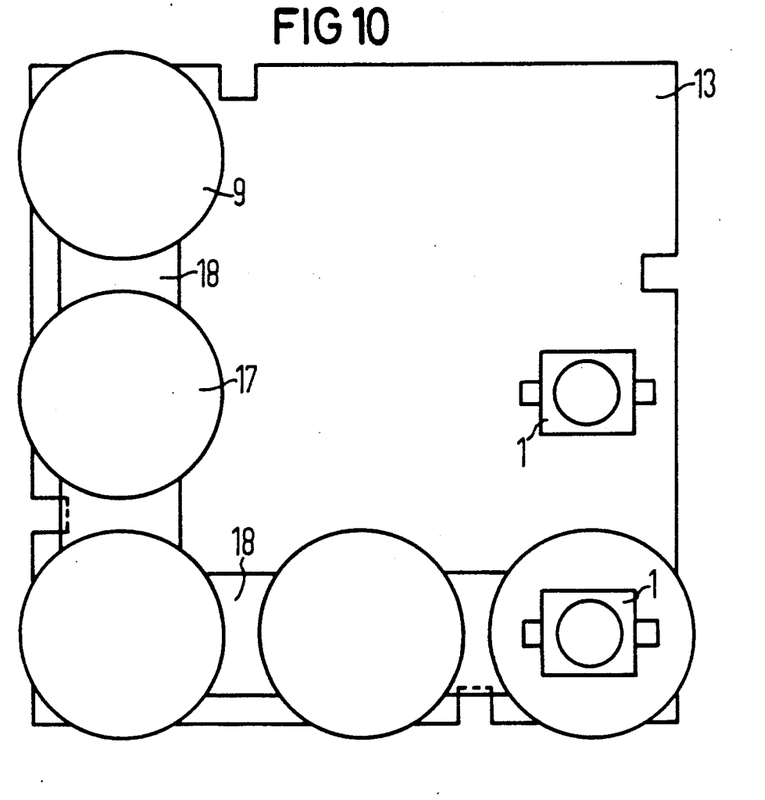

FIGS. 9 and 10 show a schematic illustration of a LED array. In this 3×3 LED array, nine base members 1 are secured on a substrate 13. The optical means 9 is thus composed of nine lenses 17. The nine lenses 17 are joined to one another as one piece via webs 18. The optical means 9 has clamps 12 with which it is secured to the substrate 13. One lens 17 is situated over every base member 1.

Figure 11:
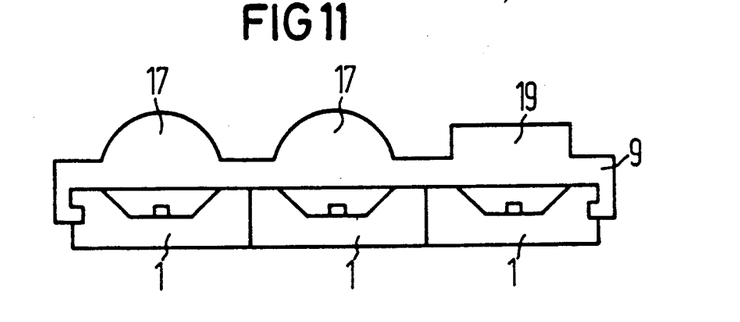

FIG. 11 shows an opto-component wherein three base members 1 are arranged side-by-side. An optical means 9 is applied onto these three base members 1. One lens 17 is thus situated over two transmitters and/or receivers, whereas a light-emitting surface 19 is applied over a third semiconductor component. Such a light-emitting surface 19 having a corresponding semiconductor component is disclosed, for example, in German Utility Model 87 13 875.1, incorporated herein by reference. The envelope of the corresponding semiconductor component thus comprises a light exit face designed as a concave lens for emitting light in an optimally large solid angle. The light-emitting surface 19 thus has the property of a diffusing disk.

Figure 12:
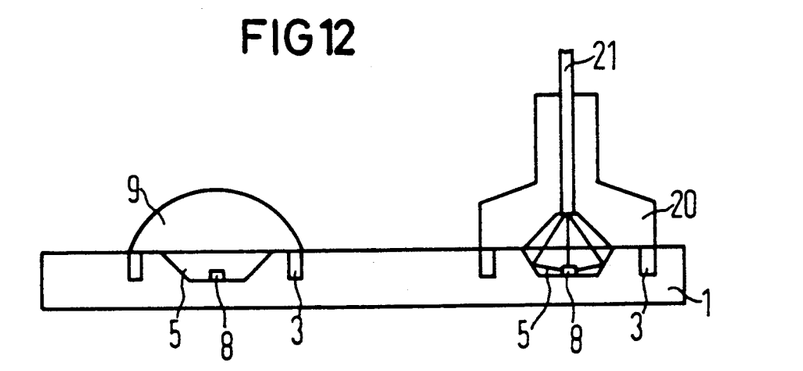

FIG. 12 shows a single base member 1 having two depressions 5. A lens is attached over the first depression 5 as optical means 9. A means 20 for producing a detachable fiber connection is attached over the second depression 5. The device 20 practically represents a light waveguide connector. The means 20 is attached to a light waveguide 21. An opto-component having an optical fiber connector can be employed as a subscriber connection in a fiber-optical communication network. Such an opto-component having an optical fiber connector can also be utilized in other fiber-optical systems such as, for example, in automobiles. Of course, integrated circuits can also be employed in the base member 1. Of course, a means 20 can also be secured to a base member with clamps.

The structure of FIG. 12 makes it superfluous to provide a mounting part for plugging in an optical conductor. An additional positioning tolerance for plugging in an optical conductor can thus be foregone. An additional miniaturization is thus possible with an opto-component having a means 20.

Both the optical transmitter as well as the optical receiver as well as integrated circuits can be arranged in a single depression 5.

Figure 13:
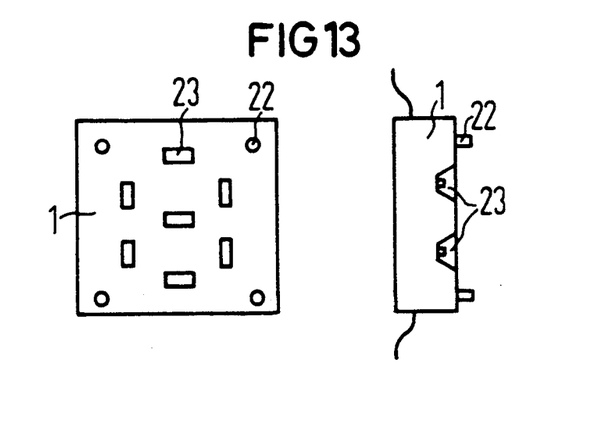
Figure 14:
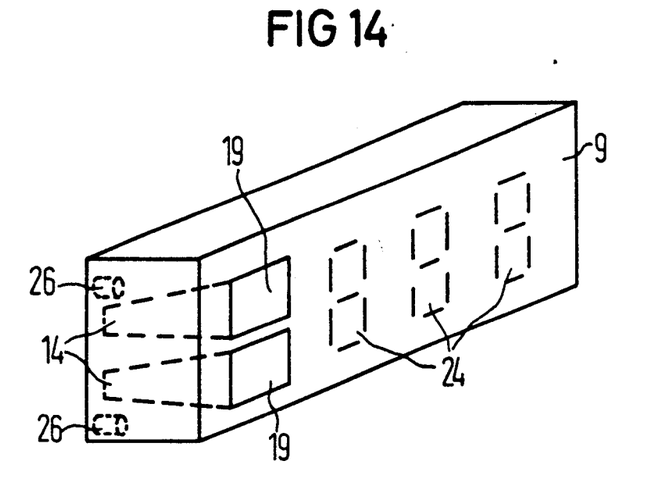

FIGS. 13 and 14 show a base member 1 and corresponding optical means 9. The base member of FIG. 13 belongs to what is referred to as a seven-segment display. Such a base member has seven light shafts 23. The base member also has pegs 22 for fastening the optical means of FIG. 14.

The optical means 9 of FIG. 14 is arranged over a plurality of base members 1 which are mounted side-by-side on a substrate. The optical means 9 of FIG. 14 has widening apertures 14 for the presentation of seven-segment displays 24. The optical means of FIG. 14 also has two light-emitting surfaces 19. Finally, the optical means 9 of FIG. 14 also has openings 26 for fastening on pegs 22 of the base members 1 of FIG. 13.

An opto-component of the invention permits a great variety of optical devices 9 given employment of only a few embodiments of the base member 1.

Figure 15:
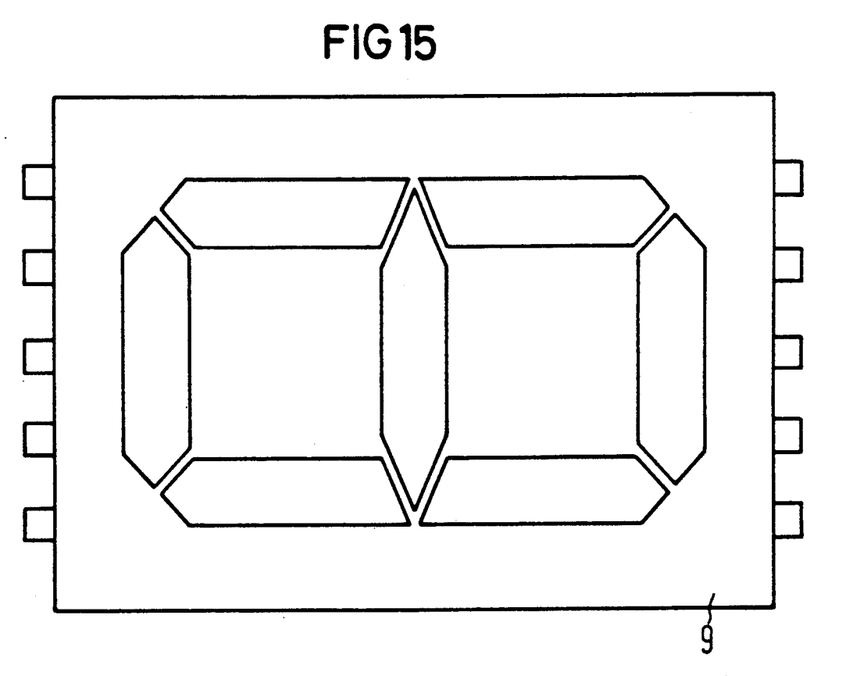
Figure 16:
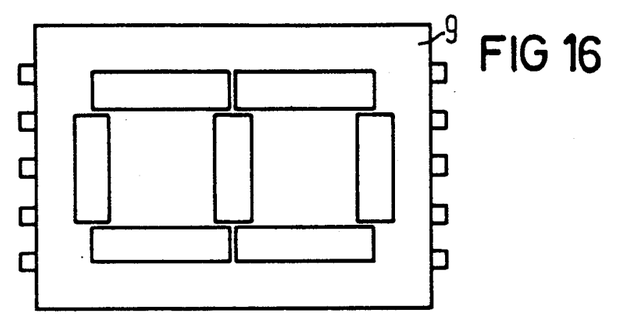
Figure 17:
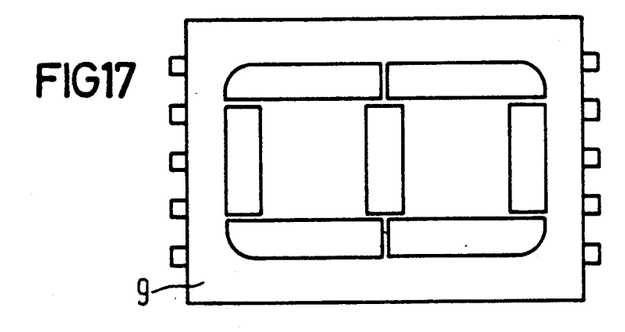

FIGS. 15 through 17 show various designs of seven-segment displays dependent on the desired use. Although the displays of FIGS. 15 through 17 have various shapings, they can be realized with the assistance of a single base member 1 of FIG. 13. The depressions 5 of the base member 1 of FIG. 13 are widened to only such an extent that different display shapes can be achieved on the basis of additional widenings 14 in the optical devices 9 of FIGS. 15 through 17.

Figure 18:
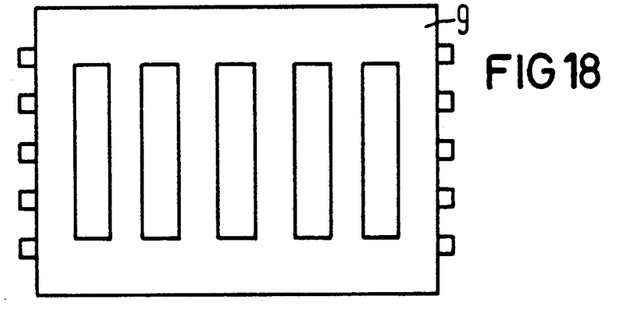
Figure 19:
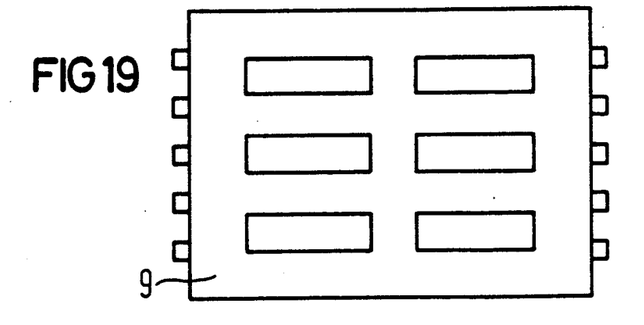

FIGS. 18 and 19 show optical devices having differently arranged light bars.

FIGS. 20 through 23 show a base member 1 on which both an optical means 9 of FIG. 18 as well as an optical means 9 of FIG. 19 having differently shaped light bars can be applied. The optical means 9 thus comprises pegs 28 that are plugged into bores 3 of the base member 1. Optical transmitters 8 are arranged in depressions (reflectors) 5 in the base member 1. These reflectors 5 are shaped such that optical means 9 having different light apertures 14 can be put in place. A diffusor 27 is also applied onto the optical means 9 for uniform illumination of the light bars.

Figure 20:
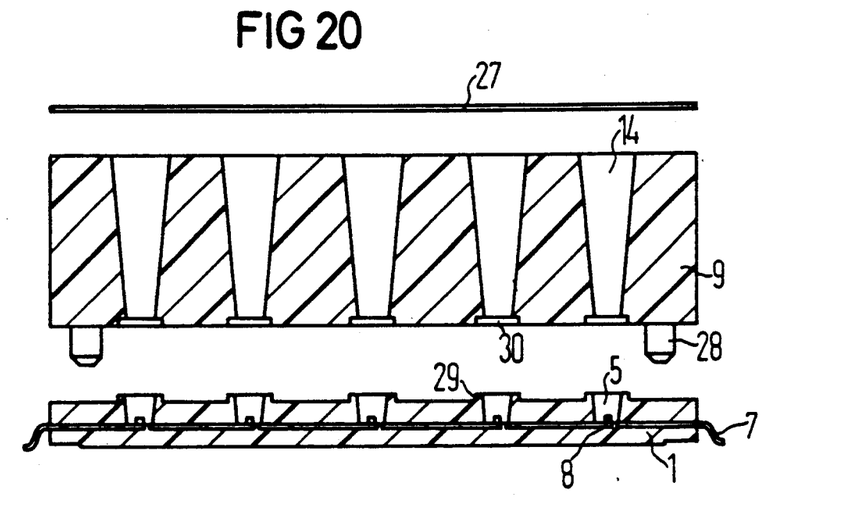
Figure 21:
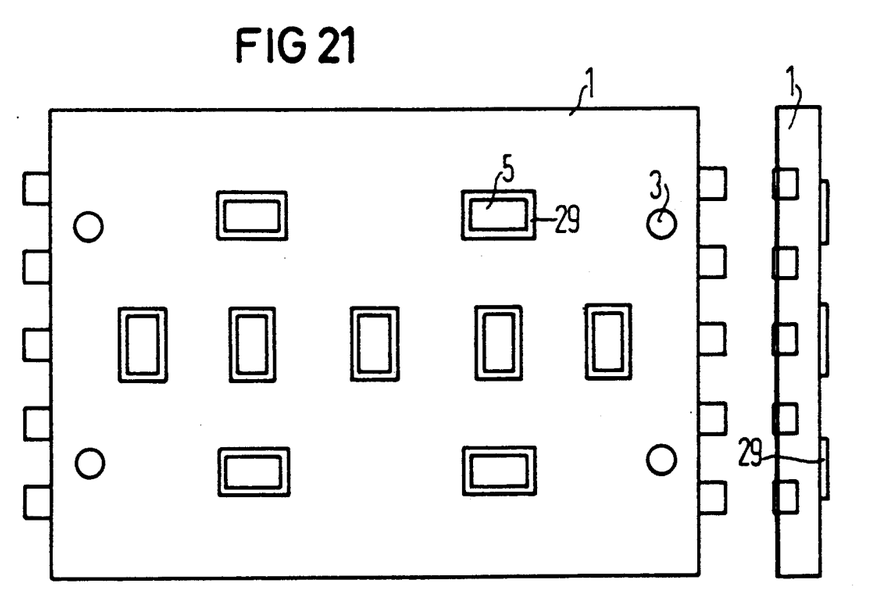
Figure 22:
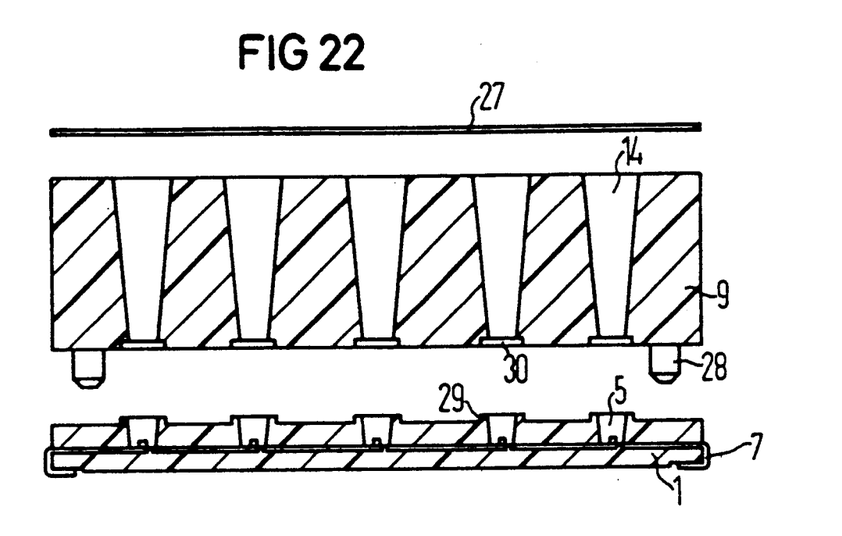
Figure 23:
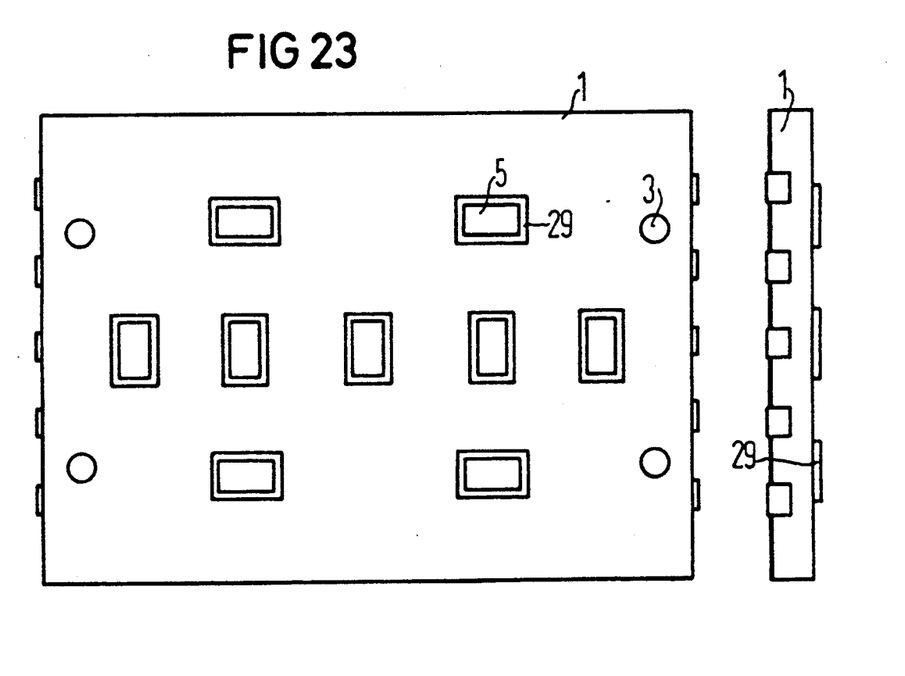

FIG. 20 shows a base member 1 wherein the ends of electrical terminals 7 point away from the base member. FIG. 22 shows a base member 1 wherein the ends of the electrical terminals 7 are bent downward toward the base member.

In FIGS. 20 and 22, the edges 29 of the depressions 5 are pulled up. These edges 29 are fitted into depressions 30 of the optical means 9. The pulled-up edges 29 prevent a cross-talk given various transmitters and/or improve the signal-to-noise ratio when receivers are arranged in depressions 5.

Although various minor changes and modifications might be proposed by those skilled in the art, it will be understood that we wish to include within the claims of the patent warranted hereon all such changes and modifications as reasonably come within our contribution to the art.

We claim as our invention:

1. A surface-mountable opto-component, comprising:
   at least one base member having a mounting surface shaped for automatic placement on a component receiving surface by use of an automatic assembly means;
   at least one optical transducer on the base member;
   at least one optical means for shaping light beams associated with operation of the transducer; and
   adjustment means on the base member for an adjusted fastening of the at least one optical means.

2. An opto-component according to claim 1 wherein the base member has means for shaping the light beams.

3. An opto-component according to claim 1 wherein the optical transducer is a semiconductor optical transmitter.

4. An opto-component according to claim 1 wherein the optical transducer is a semiconductor optical receiver.

5. An opto-component according to claim 1 wherein an optical reflector means is provided in the base member for focusing the light beams.

6. An opto-component according to claim 5 wherein the base member comprises a metal carrier and the reflector means comprises an embossment in a shape of a depression in the metal carrier.

7. An opto-component according to claim 5 wherein the optical reflector means comprises a reflective envelope of the base member.

8. An opto-component according to claim 1 wherein said base member adjustment means comprises pegs.

9. An opto-component according to claim 1 wherein said base member adjustment means comprises clamps.

10. An opto-component according to claim 1 wherein said base member adjustment means comprises grooves.

11. An opto-component according to claim 1 wherein said base member adjustment means comprises bores.

12. An opto-component according to claim 1 wherein said base member adjustment means comprises depressions.

13. An opto-component according to claim 1 wherein a deflection means is provided for changing a direction of the light beams.

14. An opto-component according to claim 1 wherein said optical means comprises a lens.

15. An opto-component according to claim 1 wherein said optical means comprises a light-emitting surface.

16. An opto-component according to claim 1 wherein said optical means comprises a light conductor connector.

17. An opto-component according to claim 1 wherein said optical means is comprised of a material which only withstands a continuous temperature up to 150° C.

18. An opto-component according to claim 1 wherein said opto-component has display means.

19. An opto-component according to claim 1 wherein said opto-component comprises an optical array.

20. An opto-component according to claim 1 wherein said optical transducer has means for transmitting optical signals.

21. An opto-component according to claim 1 wherein said opto-component has means for fiber optics transmission.

22. A surface-mountable opto-component, comprising:
   a base member having a mounting surface adapted for direct automatic placement on a component receiving surface by use of an automatic assembly means, and said base member having an upper surface designed for engagement with the automatic assembly means;
   at least one optical transducer contained within a depression of the base member, said depression being shaped to form a reflector means for directing light beams associated with the transducer;
   an optical means for shaping the light beams mounted above the depression; and
   adjustment means on the base member for an adjusted fastening of the optical means on the base member.

23. An opto-component according to claim 22 wherein the optical means comprises an optical lens.

24. The opto-component of claim 22 wherein a surface of the base member which faces away from the surface on which the base member is to be placed is substantially planar such that it can be automatically sucked up by the automatic assembly means.

* * * * *